United States Patent

White

[11] Patent Number: 5,808,924
[45] Date of Patent: Sep. 15, 1998

[54] DECIMATING IIR FILTER

[75] Inventor: Stanley A. White, San Clemente, Calif.

[73] Assignee: Boeing North American, Inc., Seal Beach, Calif.

[21] Appl. No.: 676,653

[22] Filed: Jul. 8, 1996

[51] Int. Cl.⁶ .................................................. G06F 17/10
[52] U.S. Cl. .................................. 364/724.1; 364/724.17
[58] Field of Search ............................ 364/724.1, 724.17

[56] References Cited

U.S. PATENT DOCUMENTS

| | | | |
|---|---|---|---|
| 4,972,356 | 11/1990 | Williams | 364/724.1 |
| 5,043,933 | 8/1991 | Boutaud et al. | 364/724.1 |
| 5,339,263 | 8/1994 | White | 364/724.1 |
| 5,689,449 | 11/1997 | Saramäki et al. | 364/724.1 |

Primary Examiner—David H. Malzahn
Attorney, Agent, or Firm—Tom Streeter; Charles T. Silberberg

[57] ABSTRACT

A first-order filter apparatus 48 (FIG. 4) includes an integrate-and-dump (I&D) circuit 50 and an output loop 52. The I&D circuit 50 is driven by a cyclic scaling element 54, which multiplies N consecutive input signals 56, x(m+1) to x(m+N), by a cycle of N scaling factors 58, c(1) to c(N). The I&D summer 60 drives a double-throw switch 62. The double-throw switch 62 applies the output of the I&D summer 60 to an I&D delay element 64 for N−1 input clock cycles, and for an Nth input clock cycle to the input of a non-cyclic scaling element 66. The non-cyclic scaling element 66 scales its input by a non-cyclic scaling factor, and applies its output to one input of a feedback summer 68. The output of the feedback summer 68 is y(k), the output of the apparatus. The index k advances by one every time that the index m advances by N. The output of the feedback summer 68 is also applied to an output feedback multiplying element 70, which multiplies it by $B^N$. The output feedback multiplying element 70 applies its output to a feedback delay element 72, an output of which is applied to the other input of the feedback summer 68. Additional first-order (FIG. 4), and comparable second-order (FIG. 8), filter apparatus are weighted and summed to form a filter (FIG. 10).

5 Claims, 6 Drawing Sheets

PRIOR ART

PRIOR ART

DECIMATING IIR FILTER

BACKGROUND OF THE INVENTION

This invention relates to digital signal processing and has particular relation to decimating filters, which sample the input signal at a high rate but provide the output signal at a low sampling rate. It most particularly relates to decimating filters which use an infinite-impulse-response (IIR) topology.

Analog electronic signals, suitable for being digitized and then processed by the present invention, may be extracted from any of a number of physical devices. The Digital Quartz IMU (Inertial Measurement Unit), or DQI, is one such device. Applicant has disclosed a variety of inventions related to the DQI in the following U.S. Patents:

| Patent Number | Title | Issue Date |
| --- | --- | --- |
| 5,179,380 | One-Bit Sigma-Delta Modulator with Improved Signal Stability | 01/12/93 |
| 5,339,263 | Decimator/Interpolator Filter for ADC and DAC | 08/16/94 |
| 5,361,036 | Complex Digital Demodulator Employing Chebychev-Approximation Derived Synthetic-Sinusoid Generator | 11/01/94 |
| 5,400,269 | Closed-Loop Baseband Controller for a Rebalance Loop of a Quartz Angular-Rate Sensor | 03/21/95 |
| 5,444,639 | Angular-Rate-Sensing System and Method with Digital Synthesizer and Variable-Frequency Oscillator | 08/22/95 |
| 5,444,641 | Admittance-Parameter Estimator for a Piezo-electric Resonator in an Oscillator Circuit | 08/22/95 |
| 5,459,432 | Use of a Chopper and a Sigma-Delta Modulator for Downconverting and Digitizing an Analog Signal Including Information Modulated by a Carrier | 10/17/95 |
| 5,463,575 | Reduced Quantization Noise from a Single-Precision Multiplier | 10/31/95 |
| 5,471,396 | Estimator of Amplitude and Frequency of a Noisy Biased Sinusoid from a Short Burst of Samples | 11/28/95 |
| 5,487,015 | Self-Oscillating Driver circuit for a Quartz Resonator of an Angular-Rate Sensor | 01/23/96 |
| 5,491,725 | A Tracking Filter and Quadrature Phase-Reference Generator | 02/13/96 | and in the following U.S. patent applications:

| Ser. No. | Title | File Date |
| --- | --- | --- |
| 08/356,934 | A Frequency and Phase-Locked Two-Phase Digital Synthesizer | 12/15/94 |
| 08/116,860 | Amplitude Detection and Automatic Gain Control of a Sparsely Sampled Sinusoid by Adjustment of a Notch Filter | 09/07/93 |
| 08/120,871 | Amplitude Detection and Automatic Gain Control of a Sparsely Sampled Sinusoid by Computation Including a Hilbert Transform | 09/07/93 |
| 08/316,143 | A Demodulator/Reference Generator Based on Two Cascaded Hilbert Transfomers | 09/30/94 |
| 08/383,142 | Sensor with Resonator, Digital Filter, and Display | 02/03/95 |
| 08/634,003 | Sawtooth Phase Filter | 04/15/96 |
| 08/636,088 | Measuring Amplitude of Sparsely Sampled Sinusoidal Signal | 04/22/96 |

The disclosure of these patents and applications is incorporated herein by reference.

These analog signals may be digitized at extremely high frequencies. High frequency digitization is often necessary to satisfy the Nyquist criterion: sample at more than twice the frequency of the highest frequency present. This is true even when the highest frequency present is far higher than the highest frequency of interest. It is therefore desirable to decimate to the lower frequency, and to process the decimated signal. The purpose of the decimation filter is to filter out the high frequency noise without disturbing the spectrum of the low frequency desired signal. The output of the decimation filter may then be sampled at a lower rate (decimated) without corrupting the desired signal. The lower output sample rate of the decimated signal allows processing to be done with fewer operations per second, which allows lower costs and lower power dissipation.

FIG. 1 shows one broad class of decimating IIR filters 10. Such filters are conventionally constructed by a series of i filter elements 12 in series, the end of the series having a decimator 14. The number i of filter elements 12 is equal to the number of real poles plus the number of complex conjugate pole pairs in the filter transfer function. The decimator 14 operates at a decimation ratio of N to 1 between the input signal rate and the output signal rate.

FIG. 2 shows an alternative architecture if the transfer function has no repeated poles. The filter 16 has i+1 parallel signal paths 18. Each signal path 18 has a scaling element 20, a decimating IIR filter element 22, and a weighting element 24. Depending on the transfer function sought to be mechanized, some of these elements may be absent from one or more signal paths 18. At least one signal path 18 will, however, include all three elements. The outputs of the signal paths 18 are summed in a summer 26 to provide the output of the filter 16 as a whole. Generally, this architecture is not preferred if fixed-point mechanization is used. In such cases the transfer function of the filter 16 becomes inaccurate near the zeroes because of the combination of coefficient inaccuracies. The present invention is directed toward improving this generally overlooked class of filter 16.

FIG. 3 shows the conventional first-order decimating IIR filter element 28. The element has three multipliers 30, 32 and 34, multiplying by respective constants A, B and C. A high signal rate feedback portion 36 has an input summer 38, a delay element 40, and the second, or "B" multiplier 32, connected in a loop. One input to the input summer 38 is the input to the filter element 28; the other input is the output of the "B" multiplier 32. Taps placed just before and after the delay element 40 drive respective "A" and "C" decimators 42 and 44 (each decimator 42, 44 having an N-to-1 decimation ratio), which in turn drive respective "A" and "C" multipliers 30 and 34. The outputs of the "A" and "C" multipliers 30 and 34 are summed in an output summer 46, the output of which is the output of the element 28. This configuration is completely equivalent to the transfer function $$Y/X = (A + Cz^{-1})/(1 - Bz^{-1}) \quad (1)$$

followed by an N:1 decimator.

The "B" multiplier 32 typically has a gain factor B slightly below unity, so its contribution to the low frequency transfer function gain is proportional to $1/(1-B)$. The scaling element 20 (FIG. 2) must therefore multiply the input signal by a constant no greater than the inverse factor of $(1-B)$ in order to avoid overflow in the summer 38 in the loop 36 in the presence of a full-scale input signal. Round off error in the apparatus remains the same, but now the signal is smaller. This causes the effective noise power gain to be increased by a factor of $1/(1-B^2)$. If $B=0.9$, as is typical, then the loss in dynamic range is 20 dB! This is not desirable.

A much more desirable (that is, smaller) noise power gain could be obtained by reducing B to a much smaller value, say $B=0.025$, yet keeping the transfer function the same. This seems impossible, since the transfer function depends on B. If it were possible, though, the signal-to-noise ratio at the filter output would be improved and the dynamic range of the signal unaffected.

B actually can be reduced from 0.9 to 0.025 (assuming a typical decimation rate of N=35) by replacing B with B multiplied by itself thirty-five times; $(0.9)^{35}=0.025$. In a strained sense, this is already done in the conventional filter element 22, at least in part, since the decimators 42 and 44 close only once every thirty-fifth input clock cycle (thirty-five input clock cycles equal one output clock cycle). The first input signal has therefore been passed thirty-five times around the input loop 36, and therefore has been multiplied by B thirty-five times.

The pipe dream of getting free noise reduction without affecting the transfer function vanishes, however, on considering the last input signal. It has only been passed around once. It is to keep this last signal from overflowing the summer 32 that the scaler 20 has to be kept to such a low, and noise-inducing, level.

SUMMARY OF THE INVENTION

In a conventional partial-fraction-expansion (PFE) realization of a filter as shown in FIG. 2, the first-order filter section (FIG. 3) would eliminate elements 30, 34, 44, and 46. The comparable second-order filter section (FIG. 6) would eliminate elements 98, 104, and 108, and would set element 100 (D) to unity. This is a straightforward application of the mathematics of PFE.

The present application uses a property of allpass filters that minimizes coefficient sensitivity and simplifies scaling. The topology of FIG. 2 remains the same. However, each first-order filter section is replaced by a first-order allpass filter section having a transfer function of $$Y/X=(z^{-1}-B)/(1-Bz^{-1}), \quad (2)$$

and each second-order filter section is replaced by a second-order two-multiplier Gray-Markel lattice filter section as shown in FIG. 7. The weighting of the output is done by a pair of multipliers as shown in FIG. 9.

The present invention improves the filter element 28 by exploiting a design opportunity in the feedback loop 36. It is important to keep some information content from all thirty-five input signals in each decimation cycle, and it is therefore necessary to keep the input summer 38 and the delay element 40 in the feedback loop 36. What is not necessary, however, is for the "B" multiplying element 32 to remain in the loop. A separate output loop 52 (see FIG. 4) is placed after the input loop. The output loop 52 operates at the low output signal rate, and it includes a "$B^N$" multiplying element 70.

Converting a "B" multiplier 32 in the input loop 36 to a "$B^N$" multiplier 70 in an output loop 52 requires several compensating adjustments. In the set of adjustments of the present invention, the original high signal rate feedback loop is converted into an integrate-and-dump circuit. That is, the multiplier from the high signal rate loop is eliminated, and the single-throw decimating switch is replaced with a double-throw decimating switch. Further, the fixed-valued scaling element is replaced with a cyclical-valued scaling element. The cyclical-valued scaling element cycles through a fixed cycle of scaling values, one scaling value for each input sample injected into the integrate-and-dump circuit, and one cycle for each dump of the integrate-and-dump circuit into the output loop. Careful selection of the scaling values will result in an emulation of the "A" and "C" multipliers—without, of course, most of the noise.

The remainder of the overall filter of FIG. 2—the division into parallel data paths, the weighting elements, and the summer—may be entirely conventional.

DETAILED DESCRIPTION OF THE DRAWINGS

Figure 1:
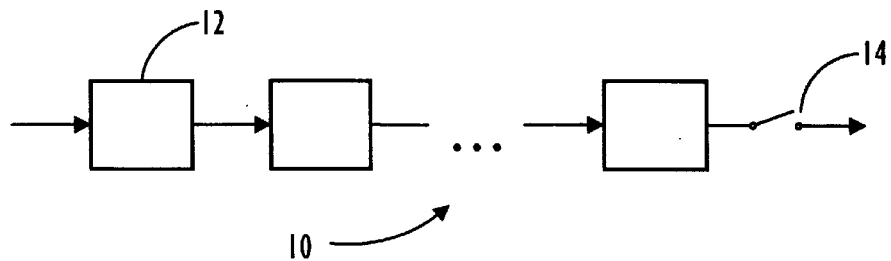
FIG. 1 is a schematic diagram of a broad class of decimating IIR filters.
Figure 2:
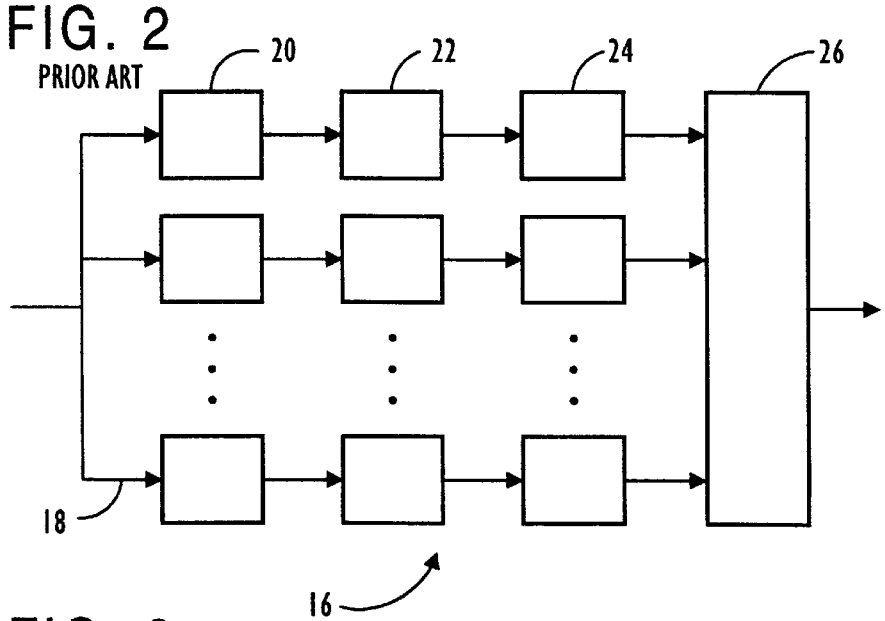
FIG. 2 is an alternative architecture of decimating IIR filters which has no repeated poles.
Figure 3:
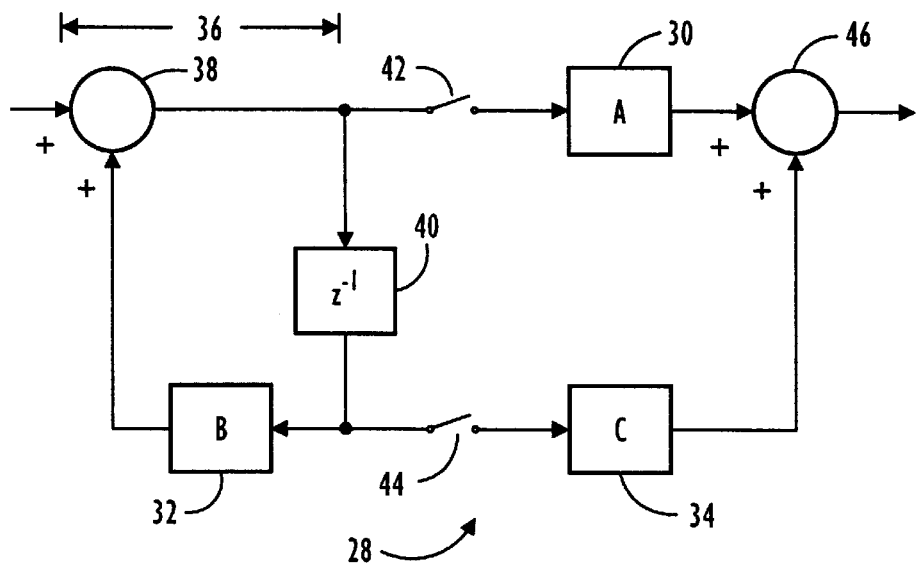
FIG. 3 shows a conventional direct-form decimating IIR first-order filter.

FIGS. 1–3 are described above, and will not be further discussed.

Figure 4:
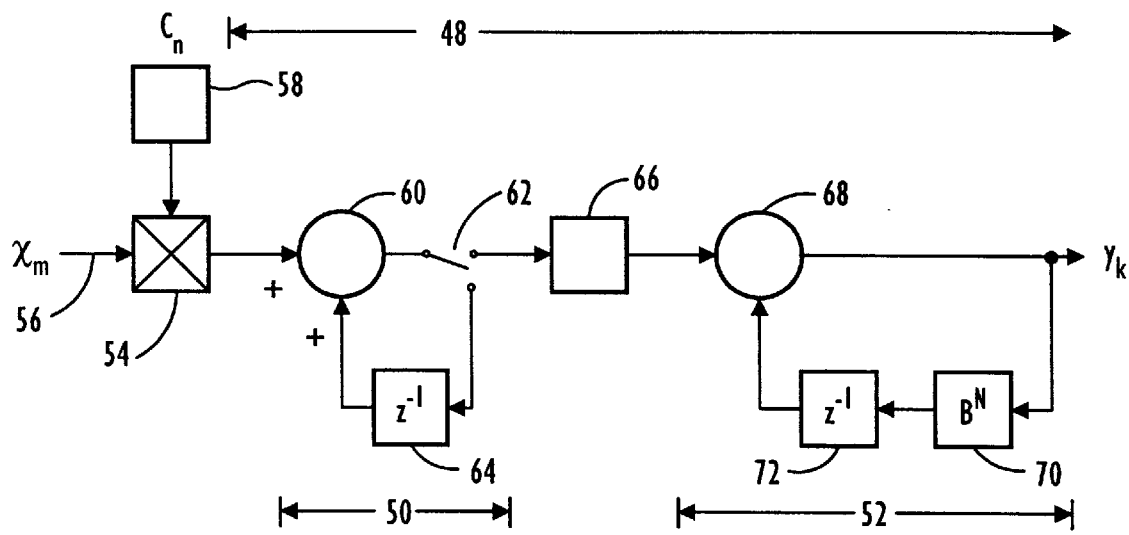
FIG. 4 is a schematic drawing of a decimating first-order filter according to the present invention.

In FIG. 4, a filter element 48 according to the present invention includes an integrate-and-dump (I&D) circuit 50 (running at the fast input rate) and an output loop 52 (running at the slow, decimated, output rate). The I&D circuit 50 is driven by a cyclic scaling element 54, which multiplies N consecutive input signals 56, x(m+1) to x(m+N), by a cycle of N scaling factors 58, c(1) to c(N). The I&D circuit 50 includes an I&D summer 60 which receives a first input from the output of the cyclic scaling element 54, and which drives a double-throw switch 62. The double-throw switch 62 applies the output of the I&D summer 60 to an I&D delay element 64 for N−1 input clock cycles. The I&D delay element 64 applies its output to the other input of the I&D summer 60. The double-throw switch 62 applies the output for an Nth input clock cycle to the input of a non-cyclic scaling element 66.

The non-cyclic scaling element 66 scales its input by a non-cyclic scaling factor, and applies its output to one input of a feedback summer 68. The output of the feedback summer 68 is y(k), the output of the filter element. The index k advances by one every time that the index m advances by N. The output of the feedback summer 68 is also applied to an output feedback multiplying element 70, which multiplies it by $B^N$. The output feedback multiplying element 70 applies its output to a feedback delay element 72, an output of which is applied to the other input of the feedback summer 68.

The filter architecture shown in FIG. 2 is applicable both when a conventional filter element 22 is used, as shown, or when the filter element 42 of the present invention is substituted for the conventional filter element 22. One of the data paths 18 of the filter 16 may be considered to be a zeroth data path, both conventionally and in the present invention. On the zeroth data path, the decimating filter element is reduced to a multiplier and decimator, without further filtering. This is equivalent to setting certain multipliers to multiply by zero or one, as appropriate.

Figure 5:
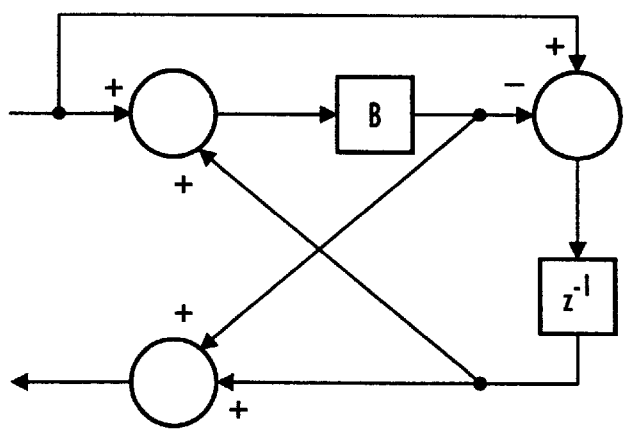
FIG. 5 shows a conventional first-order, single-multiplier Gray-Markel lattice filter.

FIG. 5 illustrates how the factors c(1) to c(N) may be calculated. FIG. 5 shows a conventional Gray-Markel filter, for which the transfer function is $$Y/X = (-B + z^{-1})/(1 - Bz^{-1}). \quad (3)$$

In the terms of FIG. 3, A=−B and C=1. Thus, $$y(m) - By(m-1) = -Bx(m) + x(m-1), \quad (4)$$

or $$y(m) = By(m-1) + x(m-1) - Bx(m). \quad (5)$$

Thus $$\begin{aligned}
y(1) &= By(0) + x(0) - Bx(1), & (6) \\
y(2) &= By(1) + x(1) - Bx(2) & (7) \\
&= B[By(0) + x(0) - Bx(1)] + x(1) - Bx(2) \\
&= B^2 y(0) + Bx(0) + (1 - B^2)x(1) - Bx(2), \\
y(3) &= B^2 y(1) + Bx(1) + (1 - B^2)x(2) - Bx(3) & (8) \\
&= B^2[By(0) + x(0) - Bx(1)] + Bx(1) + \\
&\quad (1 - B^2)x(2) - Bx(3) \\
&= B^3 y(0) + B^2 x(0) + B(1 - B^2)x(1) + \\
&\quad (1 - B^2)x(2) - Bx(3), \text{ and} \\
y(N) &= B^N y(0) + \text{sum}(n = 1 \text{ to } N)c(n)x(n). & (9)
\end{aligned}$$

Figure 6:
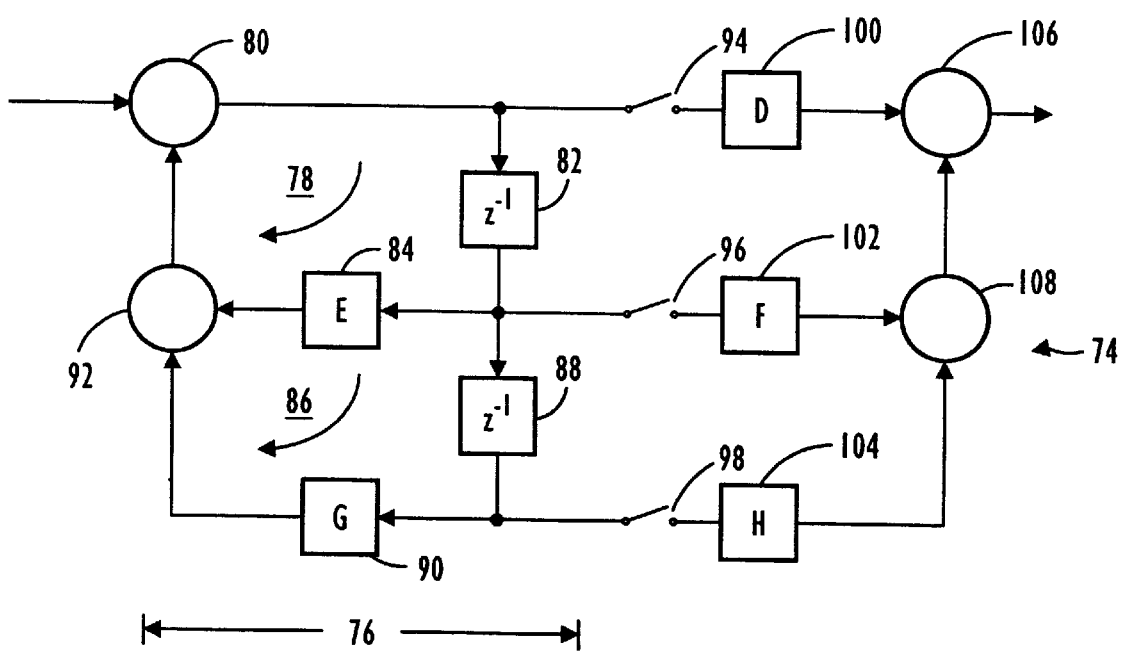
FIG. 6 shows a conventional direct form decimating second-order IIR filter.

FIG. 6 shows a conventional direct form decimating second-order IIR filter 74. Now, however, the input loop 76 is really two loops. The first input loop 78 includes the first input summer 80, first delay element 82, and "E" multiplier 84. The second input loop 86 includes second delay element 88, "G" multiplier 90, and second input summer 92. Decimators 94, 96, and 98 tap before, between, and after delay elements 82 and 88, and respectively drive "D", "F", and "H" multipliers 100, 102, and 104. The outputs of these summers are summed in first and second summers 106 and 108. This conventional second-order filter element 74 (FIG. 6) is even more subject to noise power increases that was the conventional first-order filter element 28 (FIG. 3). Now the scaling element 20 (FIG. 2) must further reduce the input signal, so that the first input summer 80 cannot overflow.

Figure 7:
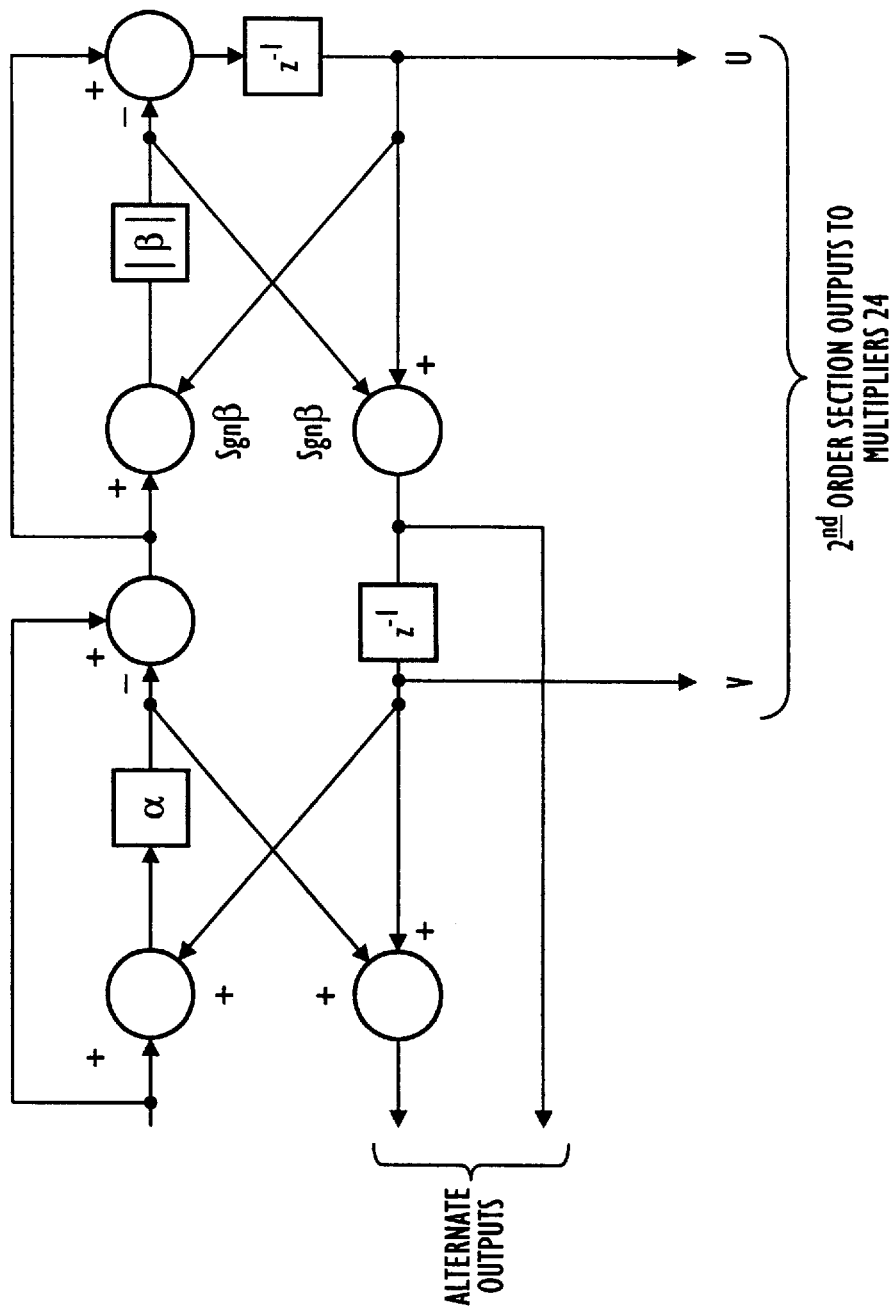
FIG. 7 shows an adaptation of a second-order, single-multiplier-per-order Gray-Markel lattice filter.

FIG. 7 shows the modified second-order Gray-Markel filter that we shall use for our baseline model in developing the second-order decimating filter. It shows a preferred set of outputs, and a set of alternate outputs, which are the equivalent thereof. A PFE will show the revised coefficients needed to implement the transfer function, and will also show the additional delay elements that must be inserted in alternative data paths to maintain synchronization.

Figure 8:
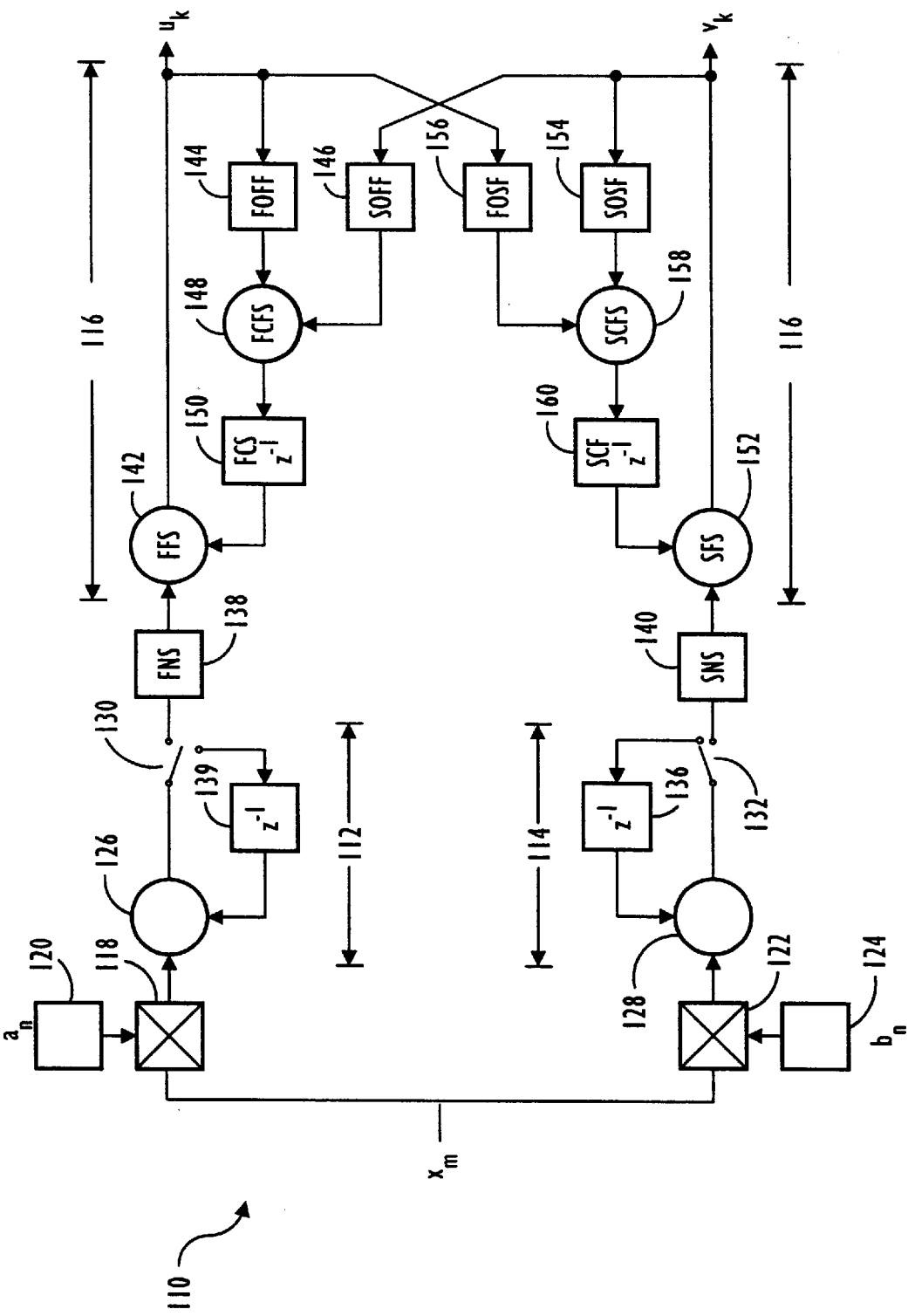
FIG. 8 shows the comparable decimating second-order IIR filter according to the present invention.

FIG. 8 shows the comparable second-order filter 110 according to the present invention as it evolves from the filter of FIG. 7. The filter 110 according to the present invention includes first and second integrate-and-dump (I&D) circuits 112 and 114; it also has a second-order cross-coupled output loop 116.

The first I&D circuit 112 is driven by first cyclic scaling element 118. Element 118 takes the N consecutive input signals 56, x(m+1) to x(m+N), of FIG. 4, and multiplies them by a first cycle of N first scaling factors 120, a(1) to a(N). The second I&D circuit 114 is driven by second cyclic scaling element 122. Element 122 also takes the N consecutive input signals 56, x(m+1) to x(m+N), of FIG. 4, but multiplies them by a second cycle of N second scaling factors 124, b(1) to b(N). The scaling factors 120, 124 may be calculated in the same way as was shown in FIG. 5.

The I&D circuits 112, 114 include first and second I&D summers 126, 128, which receive a first input from the output of the cyclic scaling elements 118, 122, and which drive double-throw switches 130, 132. The double-throw switches 130, 132 apply the output of the I&D summers 126, 128 to I&D delay elements 136, 139 for N−1 input clock cycles. The I&D delay elements 136, 139 apply their outputs to the other input of the I&D summers 126, 128. The double-throw switches 130, 132 apply the output for an Nth input clock cycle to the input of first non-cyclic scaling (FNS) element 138 and second non-cyclic scaling (SNS) element 140.

The first non-cyclic scaling (FNS) element 138 scales its input by a first non-cyclic scaling factor, and applies its output to one input of a first feedback summer (FFS) 142. The output of the first feedback summer 142 is u(k), a first output of the filter element. As with the order filter, the index k advances by one every time that the index m advances by N. The output of the first feedback summer 142 is also applied to a first-output first-feedback (FOFF) multiplying element 144, which multiplies it by a first-output first-feedback factor. A second-output first-feedback (SOFF) multiplying element 146 multiplies a second output, v(k), of the filter element by a second-output first-feedback factor. A first combined-feedback summer (FCFS) 148 adds together the outputs of the first-output first-feedback (FOFF) multiplying element 144 and the second-output first-feedback (SOFF) multiplying element 146. Its output is applied to a first combined-feedback (FCF) delay element 150, the output of which is applied to the other input of the first feedback summer 142.

Likewise, the second non-cyclic scaling (SNS) element 140 scales its input by a second non-cyclic scaling factor, and applies its output to one input of a second feedback summer (SFS) 152. The output of the second feedback summer 152 is v(k), the second output of the filter element. The output of the second feedback summer 152 is also applied to a second-output second-feedback (SOSF) multiplying element 154, which multiplies it by a second-output second-feedback factor. A first-output second-feedback (FOSF) multiplying element 156 multiplies the first output, u(k), of the filter element by a first-output second-feedback factor. A second combined-feedback summer (SCFS) 158 adds together the outputs of the second-output second-feedback (SOSF) multiplying element 154 and the first-output second-feedback (FOSF) multiplying element 156. Its output is applied to a second combined-feedback (SCF) delay element 160, the output of which is applied to the other input of the second feedback summer 152.

Figure 9:
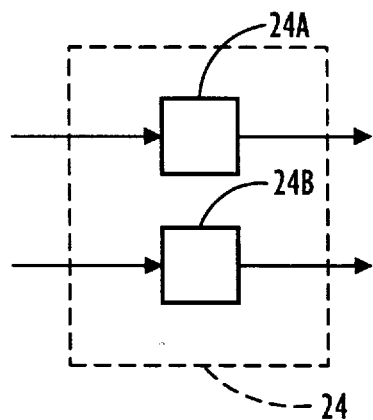
FIG. 9 shows a modified form of weighting element suitable for a second order filter.

FIG. 9 shows a modification for second-order weighting elements. The weighting element 24 (see FIG. 2) of a first-order filter (FIGS. 3 and 4) is accurately shown as a single multiplier, with a single input and a single output. This is also true for a conventional second-order filter element (FIG. 6) in a conventional PFE realization. For a second-order filter element according to the present invention (FIG. 8), however, there are two outputs, u and v. The weighting element 24 therefore includes two multipliers 24A and 24B, one for each output of the filter element. The output of each multiplier 24A, 24B is applied to the summer 26.

First-order (FIG. 4) and second-order (FIG. 8) filter elements according to the present invention have been shown. Algebraic expansion of any transfer function with unrepeated roots to a parallel form of allpass first-order filters and modified allpass form of second-order filters is straightforward. The expansion gives the values of the scaling elements 24. No matter how complicated the filter, only first- and second-order sections are needed.

Third- and higher-order filter elements are equivalent to the foregoing and could be constructed. In such elements, there are as many cyclic scaling elements as the order of the filter element. Each cyclic scaling element drives an I&D circuit, which in turn drives a non-cyclic scaling element. Each non-cyclic scaling element drives a feedback summer, the other output of which is driven by combined feedback delay element. Each combined feedback delay element is driven by a combined feedback summer, which is driven by a plurality (equal to the order of the filter) of output feedback multiplying elements. Each output feedback multiplying element feeds back a multiple of one of the outputs of the filter element. Each feedback summer produces one of the outputs of the filter element. Each output is applied to a separate multiplier in the weighting element.

Third- and higher-order filter elements have been described in more general terms because ordinary signals from ordinary physical apparatus are adequately treated with first- and second-order filters. In a first-order filter, the pole is a real number. In a second-order filter, the poles are a pair of complex conjugate numbers.

When ordinary physical systems do exhibit third- or higher-order behavior, it is in the form of one or more real poles, or one or more complex conjugate pole pairs, or some combination thereof A complex pole without its complex conjugate is found only in complex (that is, I channel/Q channel) transfer functions. It is preferable not to mechanize a third- or higher-order filters directly, but as a combination of first- and/or second-order filters, in parallel.

Figure 10:
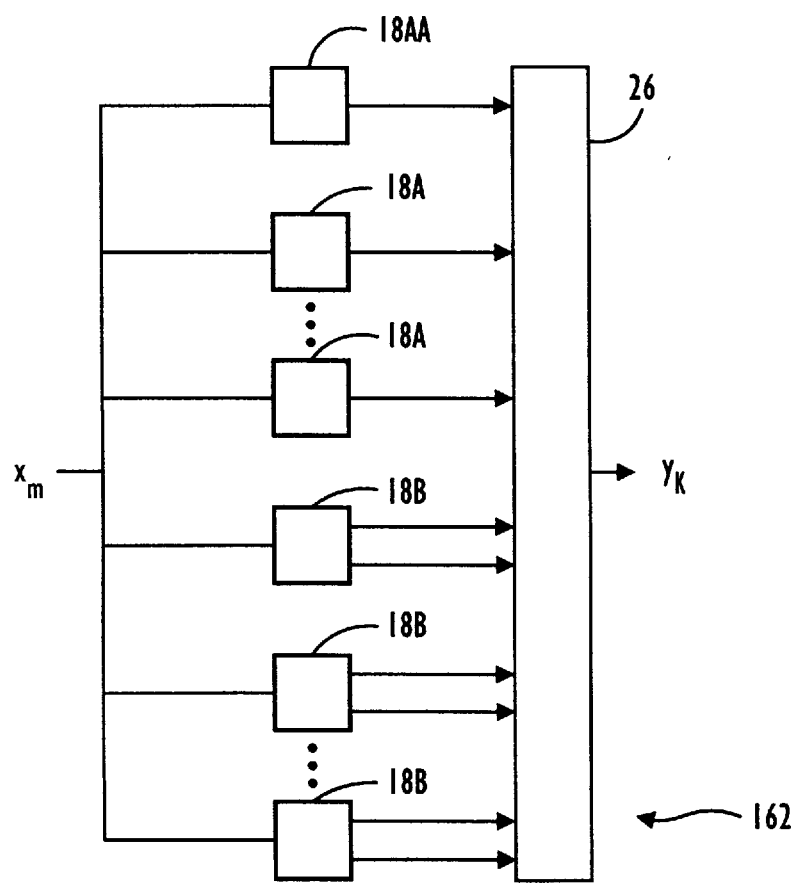
FIG. 10 shows a combination of a number of first-order filters and second-order filters, in parallel.

FIG. 10 shows a filter 162. It has a zeroth order data path 18AA, a number p of first-order data paths 18A, and a number q of second-order data paths 18B, all in parallel. All data paths 18AA, 18A, and 18B receive the same input signal x(m), and all drive the same summer 26. The output y(k) of the summer 26 is the output of the filter 162.

The zeroth order data path 18AA has a decimator 42 and a weighting element 24 only. The filter 162 will produce an output which has all of the poles which appear in any of the comparable filters consisting only of the zeroth data path 18AA and one of the other data paths 18A or 18B. It has a total of 1+p+q parallel paths. It produces p unrepeated real poles and q unrepeated complex conjugate pole pairs. p and q may each be any positive integer, or zero, but p and q may not both be zero.

SCOPE OF THE INVENTION

Several specific embodiments of the present invention have been disclosed herein, but the true spirit and scope of the present invention are not limited thereto. Such limitations are imposed only by the appended claims and their equivalents.

What is claimed is:
1. First-order apparatus adapted to decimate an input signal at an input signal rate to an output signal at an output signal rate which is N times slower than the input signal rate, the apparatus comprising:
(a) a cyclic scaling element, constructed to multiply a sequence of N consecutive input signals by a cycle of N scaling factors, an output of the cyclic scaling element being an input to the below-recited integrate-and-dump circuit;
(b) an integrate-and-dump (I&D) circuit comprising:
(1) an I&D summer, operating at the input signal rate, a first input of which is connected to receive an input to the I&D circuit;
(2) a double-throw switch connected to receive an output of the I&D summer, constructed to apply the output for N−1 input clock cycles to an input of the below recited I&D delay element, and constructed to apply the output for an Nth input clock cycle to an input of the below recited non-cyclic scaling element; and
(3) an I&D delay element, operating at the input signal rate, an output of which is connected to another input of the I&D summer;
(c) a non-cyclic scaling element, operating at the output signal rate, constructed to multiply an output of the double-throw switch by a non-cyclic scaling factor;
(d) a feedback summer, operating at the output signal rate, connected to receive an output of the non-cyclic scaling element, an output of the feedback summer being an output of the apparatus;
(e) an output feedback multiplying element, operating at the output signal rate, connected to receive said output of the apparatus, and constructed to multiply it by an output feedback factor; and
(f) a feedback delay element, operating at the output signal rate, connected to receive an output of the output feedback multiplying element and to apply an output of said delay element to another input of the feedback summer.

2. A digital electronic filter,
the filter having p unrepeated real poles, where p is a positive integer,
and the filter being adapted to decimate an input signal at an input signal rate to an output signal at an output signal rate which is N times slower than the input signal rate,
the filter comprising:
(a) means for receiving the input signal at the input signal rate and for concurrently distributing the input signal over each of the hereafter-recited parallel data paths;
(b) a zeroth data path comprising:
(1) a zeroth decimator decimating from the input signal rate to the output signal rate; and
(2) a zeroth weighting element, operating at the output signal rate, connected to receive an output of the zeroth decimator, and constructed to multiply it by a zeroth weighting factor;
(c) a number p of first-order data paths, each first-order data path comprising:
(1) first-order apparatus adapted to decimate an input signal at an input signal rate to an output signal at an output signal rate which is N times slower than the input signal rate, the apparatus comprising:
(A) a cyclic scaling element, constructed to multiply a sequence of N consecutive input signals by a cycle of N scaling factors, an output of the cyclic scaling element being an input to the below-recited integrate-and-dump circuit;
(B) an integrate-and-dump (I&D) circuit comprising:
(i) an I&D summer, operating at the input signal rate, a first input of which is connected to receive an input to the I&D circuit;
(ii) a double-throw switch connected to receive an output of the I&D summer, constructed to apply the output for N−1 input clock cycles to an input of the below recited I&D delay element, and constructed to apply the output for an Nth input clock cycle to an input of the below recited non-cyclic scaling element; and (iii) an I&D delay element, operating at the input signal rate, an output of which is connected to another input of the I&D summer;

(C) a non-cyclic scaling element, operating at the output signal rate, constructed to multiply an output of the double-throw switch by a non-cyclic scaling factor;

(D) a feedback summer, operating at the output signal rate, connected to receive an output of the non-cyclic scaling element, an output of the feedback summer being an output of the apparatus;

(E) an output feedback multiplying element, operating at the output signal rate, connected to receive said output of the apparatus, and constructed to multiply it by an output feedback factor; and (F) a feedback delay element, operating at the output signal rate, connected to receive an output of the output feedback multiplying element and to apply an output of said delay element to another input of the feedback summer; and (2) a first-order weighting element, operating at the output signal rate, connected to receive said output of the first-order apparatus, and constructed to multiply it by a first-order weighting factor; and (d) a final summer, operating at the output signal rate, connected to receive an output of each weighting element and constructed to sum them and to thereby produce an output signal from the filter.

3. Second order apparatus, adapted to decimate an input signal at an input signal rate to an output signal at an output signal rate which is N times slower than the input signal rate, the apparatus comprising:

(a) a first cyclic scaling element, constructed to multiply a sequence of N consecutive input signals by a first cycle of N first scaling factors, an output of the first cyclic scaling element being an input to the below-recited first integrate-and-dump circuit;

(b) a first integrate-and-dump (I&D) circuit comprising:
   (1) a first I&D summer, operating at the input signal rate, a first input of which is connected to receive an output of the first cyclic scaling element;
   (2) a first double-throw switch connected to receive an output of the first I&D summer, constructed to apply the output for N−1 input clock cycles to an input of the below recited first I&D delay element, and constructed to apply the output for an Nth input clock cycle to an input of the below recited first non-cyclic scaling element; and
   (3) a first I&D delay element, operating at the input signal rate, an output of which is connected to another input of the first I&D summer;

(c) a first non-cyclic scaling element, operating at the output signal rate, connected to receive an output of said first double-throw switch, and constructed to multiply it by a first non-cyclic scaling factor;

(d) a first feedback summer, operating at the output signal rate, connected to receive an output of the first non-cyclic scaling element, an output of the first feedback summer being a first output of the apparatus;

(e) a first-output first-feedback multiplying element, operating at the output signal rate, connected to receive said first output of the apparatus, and constructed to multiply it by a first-output first-feedback factor;

(f) a second-output first-feedback multiplying element, operating at the output signal rate, connected to receive the below recited second output of the apparatus, and constructed to multiply it by a second-output first-feedback factor;

(g) a first combined-feedback summer, connected to sum outputs of the first-output first-feedback multiplying element and the second-output first-feedback multiplying element;

(h) a first combined-feedback delay element, operating at the output signal rate, connected to receive an output of the first combined-feedback summer and to apply it to another input of the first feedback summer;

(i) a second cyclic scaling element, constructed to multiply the sequence of N consecutive input signals by a second cycle of N second scaling factors, an output of the second cyclic scaling element being an input to the below-recited second integrate-and-dump circuit;

(j) a second integrate-and-dump (I&D) circuit comprising:
   (1) a second I&D summer, operating at the input signal rate, a first input of which is connected to receive an output of the second cyclic scaling element;
   (2) a second double-throw switch connected to receive an output of the second I&D summer, constructed to apply the output for N−1 input clock cycles to an input of the below recited second I&D delay element, and constructed to apply the output for an Nth input clock cycle to an input of the below recited second non-cyclic scaling element; and
   (3) a second I&D delay element, operating at the input signal rate, an output of which is connected to another input of the second I&D summer;

(k) a second non-cyclic scaling element, operating at the output signal rate, connected to receive an output of said second double-throw switch, and constructed to multiply it by a second non-cyclic scaling factor;

(l) a second feedback summer, operating at the output signal rate, connected to receive an output of the second non-cyclic scaling element, an output of the second feedback summer being a second output of the apparatus;

(m) a first-output second-feedback multiplying element, operating at the output signal rate, connected to receive said first output of the apparatus, and constructed to multiply it by a first-output second-feedback factor;

(n) a second-output second-feedback multiplying element, operating at the output signal rate, connected to receive the second output of the apparatus, and constructed to multiply it by a second-output second-feedback factor;

(o) a second combined-feedback summer, connected to sum outputs of the first-output second-feedback multiplying element and the second-output second-feedback multiplying element; and (p) a second combined-feedback delay element, operating at the output signal rate, connected to receive an output of the second combined-feedback summer and to apply it to another input of the second feedback summer.

4. A digital electronic filter,
the filter having q unrepeated pairs of complex conjugate poles, where q is a positive integer, and
the filter being adapted to decimate an input signal at an input signal rate to an output signal at an output signal rate which is N times slower than the input signal rate,
the filter comprising:

(a) means for receiving the input signal at the input signal rate and for concurrently distributing the input signal over each of the hereafter-recited parallel data paths;

(b) a zeroth data path comprising:
   (1) a zeroth decimator decimating from the input signal rate to the output signal rate; and
   (2) a zeroth weighting element, operating at the output signal rate, connected to receive an output of the zeroth decimator, and constructed to multiply it by a zeroth weighting factor;

(c) a number q of second-order data paths, each second-order data path comprising:

(1) second-order apparatus adapted to decimate an input signal at an input signal rate to an output signal at an output signal rate which is N times slower than the input signal rate, the apparatus comprising:

(A) a first cyclic scaling element, constructed to multiply a sequence of N consecutive input signals by a first cycle of N first scaling factors, an output of the first cyclic scaling element being an input to the below-recited first integrate-and-dump circuit;

(B) a first integrate-and-dump (I&D) circuit comprising:

(i) a first I&D summer, operating at the input signal rate, a first input of which is connected to receive an output of the first cyclic scaling element, (ii) a first double-throw switch connected to receive an output of the first I&D summer, constructed to apply the output for N−1 input clock cycles to an input of the below recited first I&D delay element, and constructed to apply the output for an Nth input clock cycle to an input of the below recited first non-cyclic scaling element; and (iii) a first I&D delay element, operating at the input signal rate, an output of which is connected to another input of the first I&D summer;

(C) a first non-cyclic scaling element, operating at the output signal rate, connected to receive an output of said first double-throw switch, and constructed to multiply it by a first non-cyclic scaling factor;

(D) a first feedback summer, operating at the output signal rate, connected to receive an output of the first non-cyclic scaling element, an output of the first feedback summer being a first output of the apparatus;

(E) a first-output first-feedback multiplying element, operating at the output signal rate, connected to receive said first output of the apparatus, and constructed to multiply it by a first-output first-feedback factor;

(F) a second-output first-feedback multiplying element, operating at the output signal rate, connected to receive the below recited second output of the apparatus, and constructed to multiply it by a second-output first-feedback factor;

(G) a first combined-feedback summer, connected to sum outputs of the first-output first-feedback multiplying element and the second-output first-feedback multiplying element;

(H) a first combined-feedback delay element, operating at the output signal rate, connected to receive an output of the first combined-feedback summer and to apply it to another input of the first feedback summer;

(I) a second cyclic scaling element, constructed to multiply the sequence of N consecutive input signals by a second cycle of N second scaling factors, an output of the second cyclic scaling element being an input to the below-recited second integrate-and-dump circuit;

(J) a second integrate-and-dump (I&D) circuit comprising:

(i) a second I&D summer, operating at the input signal rate, a first input of which is connected to receive an output of the second cyclic scaling element;

(ii) a second double-throw switch connected to receive an output of the second I&D summer, constructed to apply the output for N−1 input clock cycles to an input of the below recited second I&D delay element, and constructed to apply the output for an Nth input clock cycle to an input of the below recited second non-cyclic scaling element; and (iii) a second I&D delay element, operating at the input signal rate, an output of which is connected to another input of the second I&D summer;

(K) a second non-cyclic scaling element, operating at the output signal rate, connected to receive an output of said second double-throw switch, and constructed to multiply it by a second non-cyclic scaling factor;

(L) a second feedback summer, operating at the output signal rate, connected to receive an output of the second non-cyclic scaling element, an output of the second feedback summer being a second output of the apparatus;

(M) a first-output second-feedback multiplying element, operating at the output signal rate, connected to receive said first output of the filter element, and constructed to multiply it by a first-output second-feedback factor;

(N) a second-output second-feedback multiplying element, operating at the output signal rate, connected to receive the second output of the apparatus, and constructed to multiply it by a second-output second-feedback factor;

(O) a second combined-feedback summer, connected to sum outputs of the first-output second-feedback multiplying element and the second-output second-feedback multiplying element; and (P) a second combined-feedback delay element, operating at the output signal rate, connected to receive an output of the second combined-feedback summer and to apply it to another input of the second feedback summer; and (2) a first second-order weighting element, operating at the output signal rate, connected to receive said first output of the apparatus, and constructed to multiply it by a first second-order weighting factor; and (3) a second second-order weighting element, operating at the output signal rate, connected to receive said second output of the apparatus, and constructed to multiply it by a second second-order weighting factor;

(d) a final summer, operating at the output signal rate, connected to receive an output of each weighting element and constructed to sum them and to thereby produce an output signal from the filter.

5. A digital electronic filter, the filter having p unrepeated real poles, the filter having q unrepeated pairs of complex conjugate poles, where p and q are each a non-negative integer, but p and q not both being equal to zero, and the filter being adapted to decimate an input signal at an input signal rate to an output signal at an output signal rate which is N times slower than the input signal rate, the filter comprising:
(a) means for receiving the input signal at the input signal rate and for concurrently distributing the input signal over each of the hereafter-recited parallel data paths;
(b) a zeroth data path comprising:
  (1) a zeroth decimator decimating from the input signal rate to the output signal rate; and
  (2) a zeroth weighting element, operating at the output signal rate, connected to receive an output of the zeroth decimator, and constructed to multiply it by a zeroth weighting factor;
(c) a number p of first order data paths, each first-order data path comprising:
  (1) first-order apparatus (FOA) comprising:
    (A) an FOA cyclic scaling element, constructed to multiply a sequence of N consecutive input signals by an FOA cycle of N scaling factors, an output of the FOA cyclic scaling element being an input to the below-recited FOA integrate-and-dump circuit;
    (B) an FOA integrate-and-dump (I&D) circuit comprising:
      (1) an FOA I&D summer, operating at the input signal rate, a first input of which is connected to receive an input to the FOA I&D circuit;
      (2) a FOA double-throw switch connected to receive an output of the FOA I&D summer, constructed to apply the output for N−1 input clock cycles to an input of the below recited FOA I&D delay element, and constructed to apply the output for an Nth input clock cycle to an input of the below recited FOA non-cyclic scaling element; and
      (3) an FOA I&D delay element, operating at the input signal rate, an output of which is connected to another input of the FOA I&D summer;
    (C) an FOA non-cyclic scaling element, operating at the output signal rate, and constructed to multiply an output of the FOA double-throw switch by a FOA non-cyclic scaling factor;
    (D) an FOA feedback summer, operating at the output signal rate connected to receive an output of the FOA non-cyclic scaling element, an output of the FOA feedback summer being an output of the FOA;
    (E) an FOA output feedback multiplying element, operating at the output signal rate, connected to receive said output of the FOA, and constructed to multiply it by an FOA output feedback factor; and
    (F) an FOA feedback delay element, operating at the output signal rate, connected to receive an output of the FOA output feedback multiplying element and to apply an output of said FOA delay element to another input of the FOA feedback summer; and
  (2) a first-order weighting element, operating at the output signal rate, connected to receive said output of the first-order apparatus, and constructed to multiply it by a first-order weighting factor;
(d) a number q of second-order data paths, each second-order data path comprising:
  (1) second-order apparatus (SOA) comprising:
    (A) an SOA first cyclic scaling element, constructed to multiply a sequence of N consecutive input signals by an SOA first cycle of N SOA first scaling factors, an output of the SOA first cyclic scaling element being an input to the below-recited SOA first integrate-and-dump circuit;
    (B) an SOA first integrate-and-dump (I&D) circuit comprising:
      (1) an SOA first I&D summer, operating at the input signal rate, a first input of which is connected to receive an output of the SOA first cyclic scaling element;
      (2) an SOA first double-throw switch connected to receive an output of the SOA first I&D summer, constructed to apply the output for N−1 input clock cycles to an input of the below recited SOA first I&D delay element, and constructed to apply the output for an Nth input clock cycle to an input of the below recited SOA first non-cyclic scaling element; and
      (3) an SOA first I&D delay element, operating at the input signal rate, an output of which is connected to another input of the SOA first I&D summer;
    (C) an SOA first non-cyclic scaling element, operating at the output signal rate, connected to receive an output of said SOA first double-throw switch, and constructed to multiply it by an SOA first non-cyclic scaling factor;
    (D) an SOA first feedback summer, operating at the output signal rate, connected to receive an output of the SOA first non-cyclic scaling element, an output of the SOA first feedback summer being a first output of the SOA;
    (E) an SOA first-output first-feedback multiplying element operating at the output signal rate, connected to receive said first output of the SOA, and constructed to multiply it by an SOA first-output first-feedback factor;
    (F) an SOA second-output first-feedback multiplying element, operating at the output signal rate, connected to receive the below recited second output of the SOA, and constructed to multiply it by an SOA second-output first-feedback factor;
    (G) an SOA first combined-feedback summer, connected to sum outputs of the SOA first-output first-feedback multiplying element and the SOA second-output first-feedback multiplying element;
    (H) an SOA first combined-feedback delay element, operating at the output signal rate, connected to receive an output of the SOA first combined-feedback summer and to apply it to another input of the SOA first feedback summer;
    (I) an SOA second cyclic scaling element, constructed to multiply the sequence of N consecutive input signals by an SOA second cycle of N second scaling factors, an output of the SOA second cyclic scaling element being an input to the below-recited SOA second integrate-and-dump circuit;
    (J) an SOA second integrate-and-dump (I&D) circuit comprising:
      (1) an SOA second I&D summer, operating at the input signal rate, a first input of which is connected to receive an output of the SOA second cyclic scaling element;
      (2) an SOA second double-throw switch connected to receive an output of the SOA second I&D summer, constructed to apply the output for N−1 input clock cycles to an input of the below recited SOA second I&D delay element, and constructed to apply the output for an Nth input clock cycle to an input of the below recited SOA second non-cyclic scaling element; and (3) an SOA second I&D delay element, operating at the input signal rate, an output of which is connected to another input of the SOA second I&D summer;

(K) an SOA second non-cyclic scaling element, operating at the output signal rate, connected to receive an output of said SOA second double-throw switch, and constructed to multiply it by an SOA second non-cyclic scaling factor;

(L) an SOA second feedback summer, operating at the output signal rate, connected to receive an output of the SOA second non-cyclic scaling element, an output of the SOA second feedback summer being a second output of the SOA;

(M) an SOA first-output second-feedback multiplying element, operating at the output signal rate, connected to receive said first output of the SOA, and constructed to multiply it by an SOA first-output second-feedback factor;

(N) an SOA second-output second-feedback multiplying element, operating at the output signal rate, connected to receive the second output of the SOA, and constructed to multiply it by an SOA second-output second-feedback factor;

(O) an SOA second combined-feedback summer, connected to sum outputs of the SOA first-output second-feedback multiplying element and the SOA second-output second-feedback multiplying element; and (P) an SOA second combined-feedback delay element, operating at the output signal rate, connected to receive an output of the SOA second combined-feedback summer and to apply it to another input of the SOA second feedback summer;

(2) a first second-order weighting element, operating at the output signal rate, connected to receive said first output of the second-order apparatus, and constructed to multiply it by a first second-order weighting factor; and (3) a second second-order weighting element, operating at the output signal rate, connected to receive said second output of the second-order apparatus, and constructed to multiply it by a second second-order weighting factor;

(e) a final summer, operating at the output signal rate, connected to receive an output of each weighting element and constructed to sum them and to thereby produce an output signal from the filter.

* * * * *